(12) United States Patent
Janik et al.

(10) Patent No.: US 7,427,757 B1
(45) Date of Patent: Sep. 23, 2008

(54) LARGE COLLECTION ANGLE X-RAY MONOCHROMATORS FOR ELECTRON PROBE MICROANALYSIS

(75) Inventors: Gary R. Janik, Palo Alto, CA (US); Jeffrey A. Moore, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 310 days.

(21) Appl. No.: 11/295,258

(22) Filed: Dec. 5, 2005

(51) Int. Cl.
*G01N 23/00* (2006.01)
*G21K 7/00* (2006.01)

(52) U.S. Cl. .................. 250/310; 250/306; 250/307; 250/311; 250/370.09; 378/43; 378/63; 378/51; 378/62; 378/64; 378/120; 378/90; 378/92

(58) Field of Classification Search .............. 250/310, 250/306, 307, 311, 370.09; 378/43, 63, 49, 378/51, 62, 64, 120, 90, 92
See application file for complete search history.

(56) References Cited

U.S. PATENT DOCUMENTS 6,710,341 B2 * 3/2004 Terauchi .............. 250/310

OTHER PUBLICATIONS

F. Adams, K. Jannsens and A. Snigirev, "Microscopic X-ray fluorescence analysis and related methods with laboratory and synchrotron radiation sources", Journal of Analytical Atomic Spectrometry, May 1998, vol. 13, pp. 319-331.*

* cited by examiner

*Primary Examiner*—Jack I. Berman
*Assistant Examiner*—Meenakshi S Sahu
(74) *Attorney, Agent, or Firm*—Joshua D. Isenberg; JDI Patent (57) ABSTRACT

X-ray monochromators and electron probe micro-analysis (EPMA) systems using such monochromators are disclosed. A turretless x-ray monochromator may have a cassette of reflectors instead of a turret. The cassette stores a plurality of reflectors that can be inserted into a conventional Rowland circle monochromator geometry. A transfer mechanism selectively moves reflectors from the cassette to a reflector positioner. The use of the cassette allows each reflector to be placed closer to a source of x-rays, thereby allowing a larger solid angle for x-ray collection. An alternative x-ray monochromator uses a non-focusing reflector that can be fixed, scanned axially or scanned radially to provide large solid angle detection of x-rays at various energies with a single reflector.

48 Claims, 4 Drawing Sheets

LARGE COLLECTION ANGLE X-RAY MONOCHROMATORS FOR ELECTRON PROBE MICROANALYSIS

FIELD OF THE INVENTION

This invention generally relates to electron probe microanalysis (EPMA). More particularly, this invention relates to analyzing the properties, such as thickness and composition, of a sample, such as layers used to form integrated circuits on a semiconducting substrate.

BACKGROUND OF THE INVENTION

Integrated circuit fabrication is typically accomplished by forming many different layers on a substrate. As used herein, the phrase integrated circuit refers to circuits such as those formed on monolithic substrates of a semiconducting material, such as group IV materials like silicon and germanium, and group III-V compounds such as gallium arsenide. Because the design tolerances of an integrated circuit are so strict, it is desirable to monitor the properties, such as thickness and elemental composition, of the various layers as they are formed. One way to measure the properties of film layers is to use electron microprobe x-ray spectrometry.

Electron microprobe x-ray spectrometry uses an electron beam source to excite a sample. X-rays having wavelengths that are characteristic of the elements of the sample are emitted from the sample over a continuous range of takeoff angles, defined as the angle between the x-ray and the sample surface. An x-ray detector assembly is positioned to detect a fraction of the x-rays that are emitted from the sample. The detector assembly can capture x-rays emitted over a finite range of takeoff angles. The detector assembly includes both a spectrometer and an x-ray detector. The spectrometer selects x-rays within a narrow range of wavelengths and directs only those x-rays to the x-ray detector. This is typically accomplished by rotating a diffractor through a range of angles, where at each angular position of the diffractor, the diffractor deflects x-rays with a given wavelength range towards the detector. The rate of impingement of the x-rays within subsets of the desired range of wavelengths is sequentially detected and measured. From this information, properties such as the elemental composition and thickness of the sample can eventually be determined.

There are several methods of detecting the x-rays with different energies. A first method uses a set of curved crystal or multilayer reflectors attached to a rotatable turret. As used herein, a "turret" refers to a carousel-like holder of one or more objects, such as reflectors, disposed in a circumferential relationship to each other with respect to some axis of rotation and positions the objects at a particular location by rotation of the holder about the axis. One reflector is positioned so that it reflects and focuses x-rays through an aperture into a gas proportional counter. The gas proportional counter converts the x-ray into an electrical pulse that is detected by an electronic detection system. Each of the reflectors on the turret can reflect and focus x-rays over a fixed Bragg energy range. At a particular position and orientation, a first reflector can reflect and focus x-rays over a first narrow energy range. This first narrow energy range is of the right size to capture the characteristic x-rays emitted by a first element. The first reflector can be rotated and repositioned to reflect x-rays emitted from a second element contained within a second narrow range within the first reflector's Bragg range. In order to capture x-rays from a third element not contained with the first reflector's Bragg range, it is necessary to rotate the turret to bring a second reflector into position. This reflector can reflect and focus the x-rays from a third element contained within a third narrow energy range and within the second reflector's Bragg range. The union of all the reflectors' Bragg energy ranges determines how many elements can be detected.

If enough detectors are included, and if they have overlapping Bragg energy ranges, it is possible to detect almost all elements in the periodic table. In addition, it is often desirable to measure the x-rays with energies on either side of the narrow range emitted from the element being measured. This can be accomplished by periodically rotating and repositioning the reflector by small amounts, and recording the number of x-rays at each position. In other words, the detector is scanned in energy. In this way the x-ray spectrum can be measured in the energy region around and including the element's narrow range. This is useful for determining the background x-ray intensity that is later subtracted from the elemental narrow range measurement to get the true x-ray intensity emitted from the element.

There are several drawbacks to the above method. For example, in order to capture the x-rays with high efficiency it is desirable for the reflector to intercept the x-rays with as large a solid angle as possible. A large solid angle for collecting x-rays allows measurements to be made quickly. This requires either positioning the reflector close to the x-ray source, or using a very large area reflector. Unfortunately, the turret design places geometrical restrictions on the number of large solid angle reflectors that can be accommodated by the turret. Commercially available systems typically accommodate from two to a maximum of six reflectors. It is desirable to have a larger number of reflectors, both to be able to cover a large number of elements and to optimize the efficiency for each element.

Prior art x-ray detection systems suffer from other drawbacks. For example, in order to have a reflector with a moderately large Bragg energy range, or to be able to scan it to measure a spectrum, it is necessary for it to be curved in a circular cylindrical shape. An inside surface of the cylindrical reflector has multilayer dielectric coating having a d-spacing that is constant over a surface of the dielectric. The reflector, source (e.g., sample surface) and detector are located at points on a circle known as the Rowland circle such that the detector stays at a linear focus of the reflector. The Rowland circle has a diameter that is half the diameter of the cylindrical reflector. Unfortunately, a circular cylindrical reflector is not an optimum shape to achieve the best efficiency for a particular element. In addition, the solid angle for collecting x-rays is limited to about 0.03 steradians.

Attempts have been made to improve the efficiency of cylindrical reflectors. One technique uses a multilayer d-spacing having a gradient across the reflector to keep the efficiency high. Unfortunately, the optic cannot be scanned with much efficiency and the solid angle for collection of x-rays is limited to about 0.10 steradians. Another technique uses a three-dimensional ellipsoidal multilayer optic that can focus x-rays from a point source to a small spot image. Unfortunately, the ellipsoidal shape is difficult and expensive to manufacture. In addition. the ellipsoidal multilayer optic also uses a multilayer dielectric with a graded d-spacing. Consequently, the optic cannot be scanned.

What is needed, therefore, are large collection angle x-ray monochromators that can overcome some of the problems described above.

SUMMARY OF THE INVENTION

Embodiments of the present invention are related to turretless x-ray monochromators and electron probe micro-analysis (EPMA) systems using such monochromators.

A first embodiment of the invention relates to a turretless x-ray monochromator. The monochromator may use a cassette of reflectors instead of a turret. The cassette stores a plurality of reflectors that can be selectively inserted in situ into a conventional Rowland circle monochromator geometry. A transfer mechanism selectively moves reflectors from the cassette to a positioning mechanism. The use of the cassette allows each reflector to be placed closer to a source of x-rays, thereby allowing a larger solid angle for x-ray collection.

A second embodiment of the invention uses a non-focusing reflector that can be fixed, scanned axially or scanned radially to provide large solid angle detection of x-rays at various energies with a single reflector.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1:
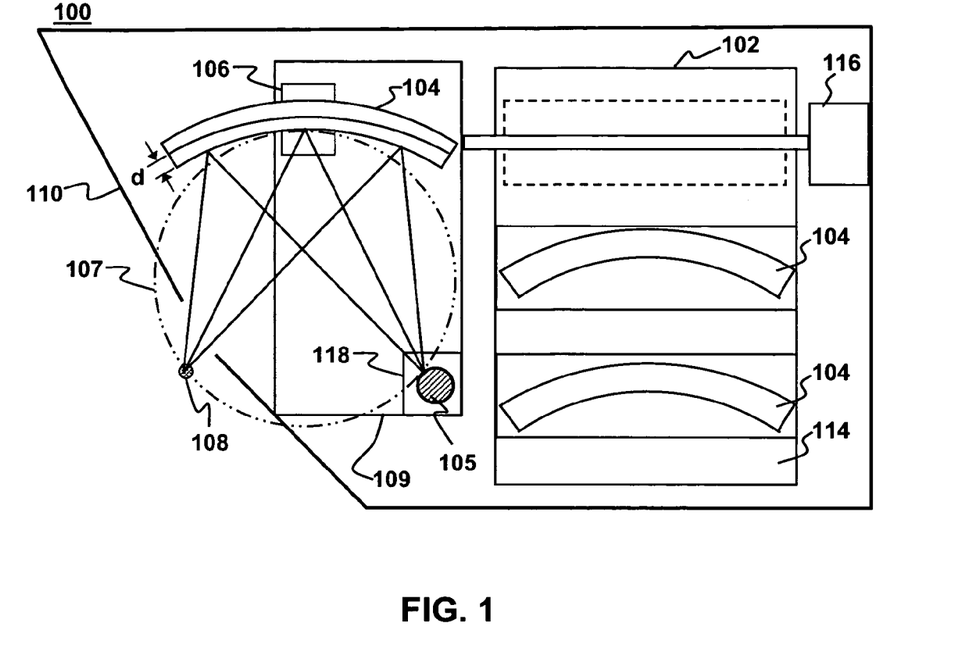
FIG. 1 is a schematic diagram of a cassette-based turretless x-ray monochromator according to an embodiment of the present invention.
Figure 2:
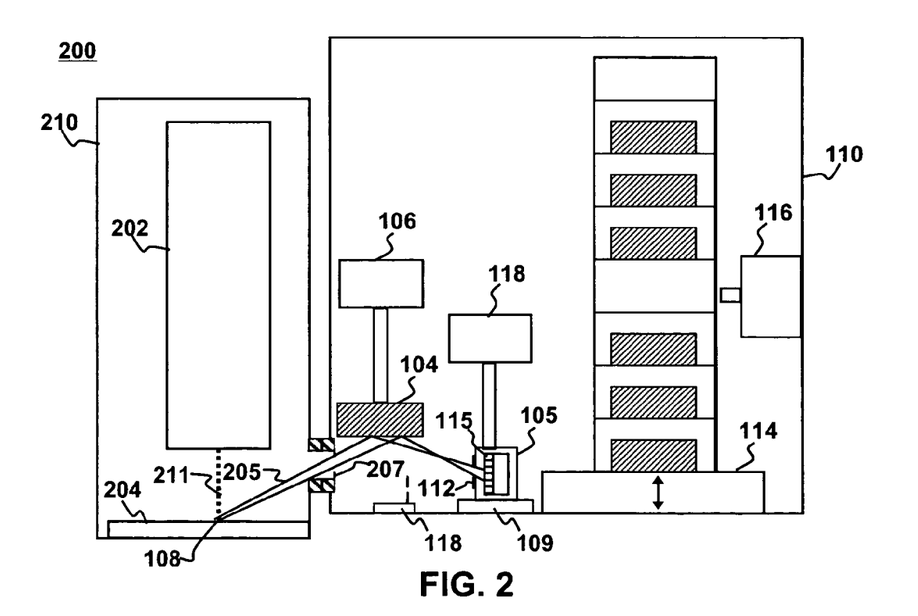
FIG. 2 is a schematic diagram of an electron probe microanalyzer (EPMA) that uses a cassette-based x-ray monochromator according to an embodiment of the present invention.

As illustrated, e.g., in FIG. 1 and FIG. 2, certain embodiments of the present invention use a cassette of reflectors instead of a turret. FIG. 1 depicts an x-ray monochromator 100 according to a first embodiment of the present invention.

The monochromator includes a cassette 102 adapted to retain multiple x-ray reflectors 104 and an x-ray detector 105. A positioning mechanism 106 selects a reflector 104 from the cassette 102 and rotates it into position for reflection of x-rays from a known location 108 toward the detector 105. With the cassette 102, one or more x-ray reflectors may be selectively positioned in situ in close proximity to the known location 108. As used herein, the term "selectively positioned in situ" refers to placing an object into position in a closed chamber without having to open the chamber. It will be seen from the following discussion that the use of the cassette allows the reflectors to be selectively positioned in situ in close proximity to the known location 108 without the use of a turret.

In the example depicted in FIG. 1, the positioning mechanism, positions the x-ray reflectors such that have a reflecting surface that intersects a Rowland circle 107. The detector 105 and known location may also lie on the Rowland circle 107. The cassette 102 could be placed at a large enough distance from known location 108 that it would not interfere with placing the reflector 104 close enough to the known location to collect a large solid angle (e.g., greater than about 0.010 steradians. The set of reflectors 104 could include more than 5 reflectors, and is not limited by the geometrical constraints of the x-ray source region.

By way of example, and without limitation, the reflectors 104 may include one or more scannable reflectors, e.g., having a circular cylindrical symmetry about an axis perpendicular to the plane of the drawing in FIG. 1. Alternatively, the reflectors 104 may include one or more elliptical cylindrical reflectors or one or more ellipsoidal reflectors. The reflectors 104 may have a multilayer coating characterized by an interlayer spacing d (referred to herein as the d-spacing). The multilayer coating may be made of alternating layers of metal and carbon or metal and silicon or different metals, e.g., chromium and scandium. Each layer may be about 10 angstroms thick. The interlayer spacing d of the coating determines the Bragg angle $\theta_B$ with respect to a plane of the coating for constructive interference of the x-rays. The condition for constructive interference is $2d \sin \theta_B = m\lambda$, where, m is an integer and $\lambda$ is the x-ray wavelength. The x-ray wavelength may be related to the x-ray energy E by $E=hc/\lambda$, where h is Planck's constant and c is the speed of light. The coating may have a d-spacing with a gradient such that the d-spacing varies across the surface of the reflector 104. The d-spacing may vary along a circumference of the reflector 104, in a direction perpendicular to the axis of curvature. The d-spacing of the multilayer coating may be selected for different energy wavelength ranges. Different materials for the multilayer coating may be used along with different d-spacings, in order to optimize performance for different wavelength ranges. For example, a tungsten-silicon multilayer dielectric may have a 2d-spacing of about 60 angstroms. A chrome-scandium multilayer dielectric may be used to produce a d-spacing of about 80 angstroms.

The set of reflectors 104 may also include non-scannable reflectors highly optimized for individual elements. These non-scannable detectors could have one or more of the following properties: multilayer coatings that are not efficient at more than one narrow energy range, multilayer coatings that have a graded interlayer spacing d for increased solid angle collection, elliptical cylindrical shapes for improved focusing and background rejection, and doubly curved ellipsoidal shapes for very large solid angle collection and improved background rejection.

By way of example, the reflectors 104 may include between 7 and 20 different reflectors with a different reflector for every K, L and M x-ray line between about 0.15 keV and about 2.0 keV. Such a set of reflectors would allow detection of K-lines for boron, carbon, nitrogen, oxygen, sodium, and fluorine, L-lines for cobalt, copper, gallium, arsenic, nickel and zinc, among others.

The reflectors 104 are placed into position by the reflector positioning mechanism 106. This would also scan the reflector during a spectrum measurement. The mask containing the aperture and the detector are mounted on a base plate 109. This base plate is positioned and scanned by the positioning mechanism 106. The cassette 102 is moved vertically by the cassette positioner 114. This allows the reflector 104 to always be picked up or replaced at the same location by a transfer mechanism 116. By way of example, the transfer mechanism 116 may be in the form of a reflector pusher used to push the reflector 104 out of the cassette 102 into the reflector positioning mechanism 106 with a simple linear motion. A detector positioner 118 may be used to position the detector 105, e.g., to keep the detector on the Rowland circle 107.

The x-ray detection system 100 may include a vacuum chamber 110 that houses the x-ray detector 105. The x-ray detector 105 may have an entrance aperture 112 that restricts the entry of x-rays into the detector 105. The cassette 102, reflectors 104 and positioning mechanism 106 may be situated within the vacuum chamber 110. In some circumstances, it may be desirable to have more than one mask aperture 112 available for use with the x-ray monochromator 100. For example circular cylindrical reflectors focus to a wide linear spot, elliptical cylindrical reflectors focus to a narrower linear spot, and ellipsoidal reflectors focus to a small circular spot. In order to get the optimum background rejection for each type of reflector, it is best to use an aperture only slightly larger than the focal spot and of the same shape. More than one aperture could be mounted on an aperture selector mechanism 118, which in turn is mounted on the detector base plate 109. The aperture selection mechanism may selectively place different apertures in front of the detector 105.

The vacuum chamber 110 may be attached to the source of x-rays, which may be an EPMA system 200 as depicted in FIG. 2. The EPMA system 200 includes an electron beam column 202 that directs a beam of electrons 211 onto a surface of a sample 204. An interaction between the sample and the electrons 211 generates x-rays 205. The electron beam column 202 and sample 204 may be housed within a vacuum chamber 210. The vacuum chamber 110 containing the x-ray monochromator 100 is attached to the EPMA system 200 so that an entry aperture 207 is aligned as an x-ray detector port for the EPMA system 200. The vacuum chambers 110, 210 may be provided with sealing flanges to ensure a good vacuum seal. In this way, the invention would replace one of the standard detectors on an EPMA system. An example of a suitable EPMA system is the Metrix 100 available from KLA-Tencor Corporation of San Jose, Calif.

Figure 3:
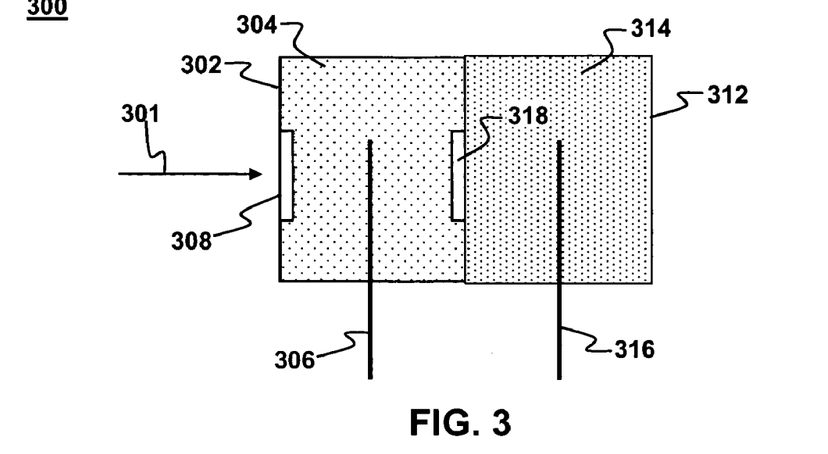
FIG. 3 is a schematic diagram of a dual chamber gas proportional counter that may be used in turret-less x-ray monochromators according to embodiments of the present invention.

Any suitable type of x-ray detector may be used as the x-ray detector 105 in x-ray monochromator of FIG. 1 and the EPMA system of FIG. 2. By way of example, the detector 105 may be a dual chamber gas proportional counter 300 as illustrated in FIG. 3. The counter 300 includes a first chamber 302 containing a first gas 304 and a first anode 306. X-rays 301 enter the first chamber 302 through a first window 308 and initiate a discharge to the first anode 306 though interactions with the first gas 304. Some of the x-rays entering the first chamber 302 may subsequently enter a second chamber 312 having a second gas 314 and second anode 316. A second window 318 allows x-rays to enter the second chamber 312 from the first chamber 302. The use of two different gases 304, 314 and windows 308, 318 made of different materials allows the detector 300 to detect x-rays in different energy ranges. By way of example, the first gas 304 may be neon gas, the second gas 314 may be xenon gas, the first window 308 may be made of a polymer and the second window 318 may be made of beryllium. Alternatively, a combination of xenon and carbon dioxide gases may be used.

In certain embodiments, the detector 105 may be a position sensitive detector having an array of two or more detector elements 115 as indicated in FIG. 2. Each element, e.g., a charge-coupled-device, semiconductor detector, etc., may be located at a different location. X-rays emerging at different angles from the known location 108 on the sample 204 strike the detector 105 at different positions. Thus, the position of detection can provide angular information about the x-rays. The angular information, in turn, can provide information about the sample, 204. For example, the sample may include a copper layer overlying tantalum nitride layer disposed on a silicon substrate. In this example, there are three variables of interest, which are the thickness of the tantalum nitride layer, the nitrogen concentration of the tantalum nitride layer, and the thickness of the copper layer. Without the angle resolved detection the EPMA system 200 would generate only three data values, which are the copper x-ray counts, the tantalum x-ray counts, and the nitrogen x-ray counts. With such limited data, it is generally quite difficult to distinguish variations in the nitrogen concentration of the tantalum nitride layer from thickness variations in the copper layer, because the copper layer tends to absorb the nitrogen x-rays as they are emitted from the tantalum nitride layer. Thus, the data tends to be confounded between at least two possible causes of variation.

However, nitrogen x-ray absorption produces an angle dependent intensity. Nitrogen x-rays with higher takeoff angles, or in other words with takeoff angles that are closer to perpendicular to the surface of sample 204, will tend to be more intense because the nitrogen x-rays have traveled through less of the copper layer thickness as they escaped the sample. This angular variation in x-ray intensity provides additional information in regard to both the thickness of the copper layer and the concentration of the nitrogen in the tantalum nitride layer. The reflector 104, e.g., a parabolic collimator is preferably adapted to work best for low energy x-rays like nitrogen, and a 12 degree range of collected takeoff angles is enough to detect a significant variation in x-ray intensity with takeoff angle using a position sensitive detector as the detector 105.

The above embodiments of the present invention overcome a tradeoff between efficiency and flexibility. The above embodiments enable detection of a wide range of x-ray energies and a large number of elements, while maintaining optimum detection efficiency for each. It also does all this while taking up the space of a single x-ray detector on an EPMA system, leaving room for multiple standard detectors on the other ports. In the above embodiments the reflector selection mechanism is removed from the x-ray source region in order to maintain a large solid angle of x-ray collection. The cassette-based design also facilitates combining both scannable and non-scannable reflectors in a single detector system.

Alternative embodiments of the present invention use a reflector with a shape that does not focus the x-rays. Dropping the requirement of focusing allows much greater freedom in choosing the shape and it can be optimized for various combinations of solid angle collection, ease of manufacture, and scanning. The non-focusing optic requires a larger detector than a focusing detector, due to its diffuse output. This detector can be either a gas-filled proportional counter (e.g., as shown in FIG. 3) or a solid state detector. In either case, the detector can be in the form of an array and can determine the position of the x-ray on the detector in order to determine the angle of the incoming x-ray as described above.

Figure 4:
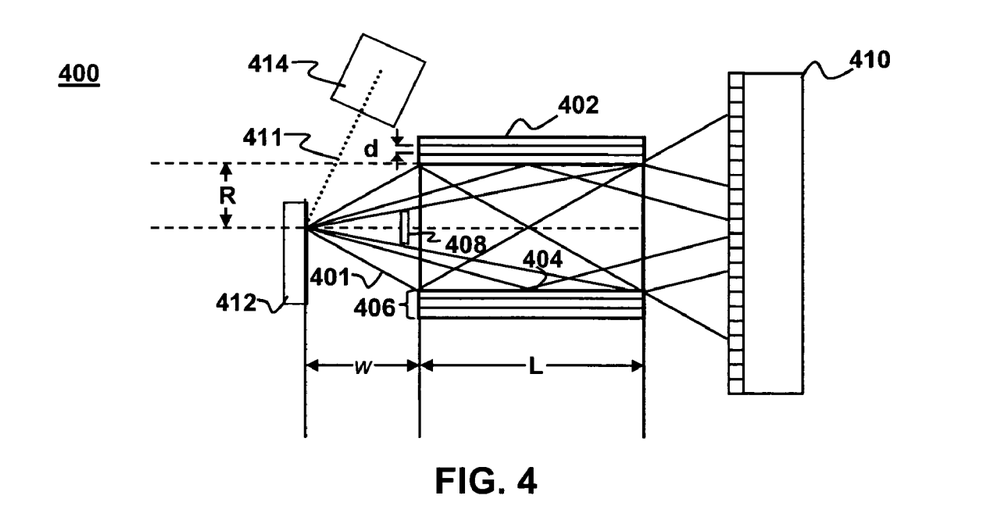
FIG. 4 is a longitudinal cross-sectional schematic diagram of another turret-less x-ray monochromator according to another embodiment of the present invention.

By way of example and without limitation, FIG. 4 depicts an x-ray monochromator 400 according to an alternative embodiment of the present invention. In this example, the monochromator 400 includes an x-ray optic 402 in the shape of a cylinder. X-rays 401 emerge from a source located on a central axis z of the cylinder. An inside surface 404 of the optic 402 has a multilayer coating 406. A d-spacing d of this coating may be graded to maintain the correct Bragg angle along the length of the optic 402. A central region of the cylindrical optic 402 is blocked by a disc 408 of x-ray absorbing material to prevent unreflected x-rays and stray electrons from entering a detector 410. The optic 402 may be in a fixed positional relationship with respect to the source of x-rays 401. By way of example, in an EPMA, the x-rays 401 may be produced at a surface of a sample 412 as a result of interaction with a beam of electrons 411 from an electron column 414. The detector 410 may be an array of detectors, as described above, to allow for position sensitive angle-dependent detection of x-rays of different take-off angles from the source, as described above.

A maximum length L of the optic without double reflection is 2w, where w is a working distance between a front end of the optic and the known location of the source of x-rays (e.g., the sample surface in the case of an EPMA system). Double reflection of the x-rays by the optic 402 is not desirable since the second reflection typically has nearly zero efficiency due to the graded multilayer coating 406. In practice the optic 402 may be manufactured in two or more sections, split along the axis, in order to allow the multilayer coating to be deposited or otherwise formed on the inside of the cylinder.

It is possible to construct a radial scanning version of the monochromator 400 if the cylindrical optic 402 is fabricated such that it has a variable radius R. If the radius R is increased, the optic 402 can reflect x-rays emerging at angles with respect to the surface normal. The larger the angle, the smaller the energy of the x-rays. Thus, for a larger radius R, x-rays of a smaller energy will be reflected to the detector. If the original angle of incidence is not too large, x-rays of approximately the same energy will be reflected at all positions of the cylindrical optic 402. In other words, the reflectivity response versus energy will shift, but not broaden significantly. This is just what is desired for a scanning monochromator. The blocking disc 408 preferably moves forward as the cylinder radius R increases in order to prevent unreflected x-rays from passing through to the detector.

Figure 5A:
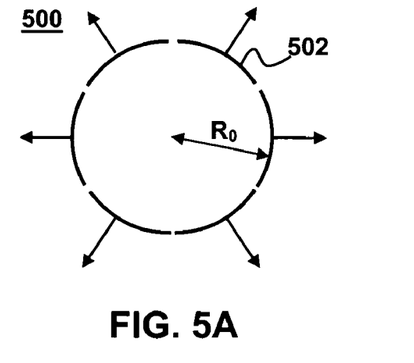
FIGS. 5A-5B are axial schematic cross-sectional diagrams depicting radial scanning with a turret-less x-ray monochromator according to an embodiment of the present invention.
Figure 5B:
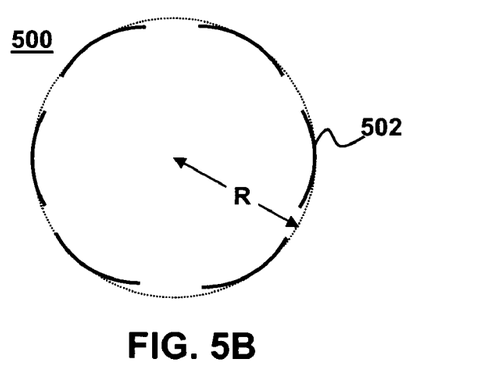

FIGS. 5A-5B depict an example of a radially scanning x-ray optic 500 that may be used as the optic 402 in the monochromator 400. In this example the optic 500 is made in multiple cylindrical segments 502 that can move radially with respect to a common central axis. Each segment may include on an interior surface thereof a multilayer dielectric coating, which may have a d-spacing that varies along the axis. As a practical matter, each segment 502 may be made of a substantially rigid material that does not change its curvature as they move radially. As a result, when the array expands from an initial radius $R_0$ to an expanded radius R, the reflecting surface of the expanded array of cylindrical segments 502 would not be circular. The non-circularity could introduce additional broadening, but increasing the number of segments limits this effect.

Figure 6:
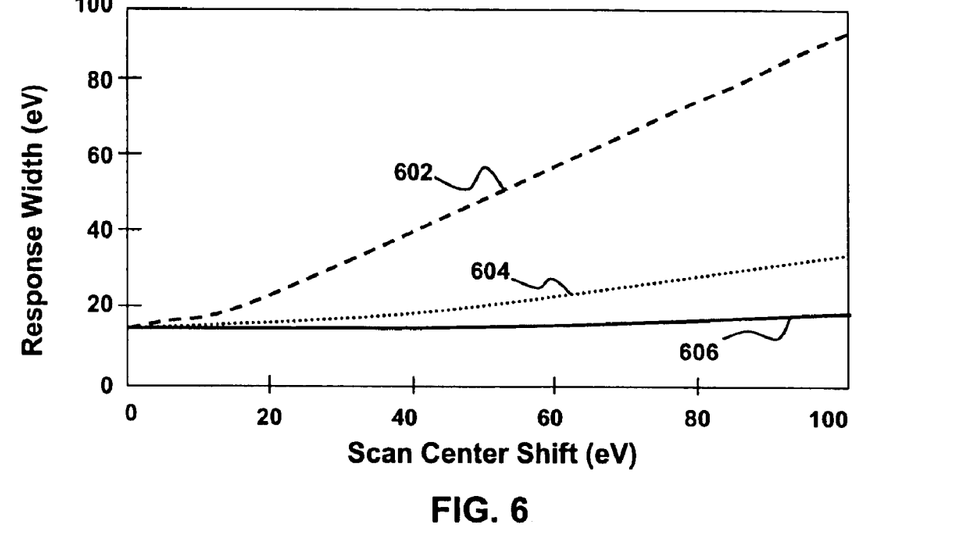
FIG. 6 is a graph illustrating response width versus scan center shift for axial and radial scanning with turret-less x-ray monochromators according to embodiments of the present invention.

FIG. 6 depicts a plot of broadening versus energy shift for different numbers of segments. A dashed line 602 indicates broadening where a cylindrical optic of fixed radius is scanned axially with respect to the source of x-rays. A dotted line 604 indicates broadening where a four-segment cylindrical optic is scanned radially. A solid line 606 indicates broadening for a six-segment cylindrical optic that is scanned radially. From these graphs it can be seen that it is desirable to have at least six (6) segments to keep the broadening to an acceptable level.

Figure 7A:
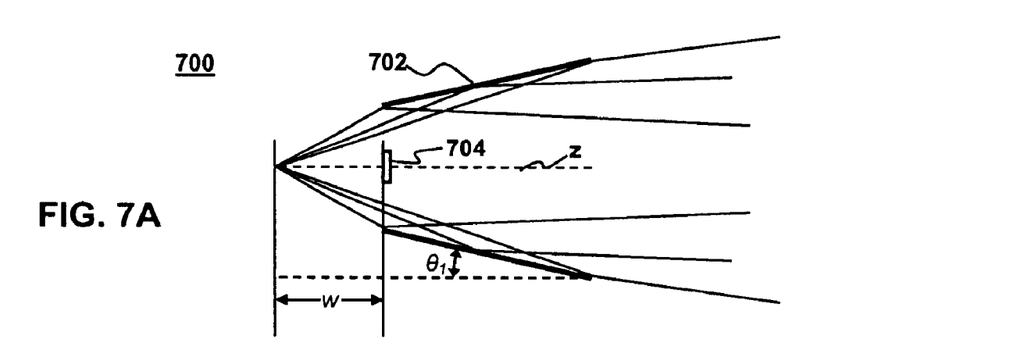
FIGS. 7A-7B are longitudinal cross-sectional schematic diagrams of alternative turret-less x-ray monochromators according to embodiments of the present invention.

Other non-focusing shapes are possible for the optic 402. For example, FIG. 7A depicts a conical non-focusing optic 700 having a reflector surface 702 in the shape of a truncated cone and an x-ray blocking central disc 704. The optic 700 can collect even larger solid angles than a cylindrical design. Although such a design cannot be practically scanned, it is useful for angle sensitive detection, as described above.

Figure 7B:
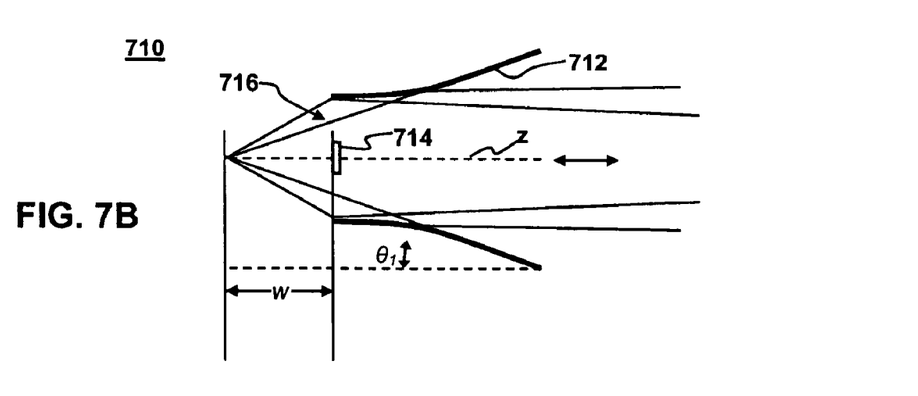

A more complicated horn-like optic 710 is shown in FIG. 7B. The optic 710 includes a reflector 712 having a horn-like shape and a central stop 714. An advantage of such a design is that the reflector can be scanned in the axial direction (i.e., by moving the optic 712 along a symmetry axis z of the reflector 712). Such a configuration may be more practical than a radial scan of a cylinder.

Figure 8:
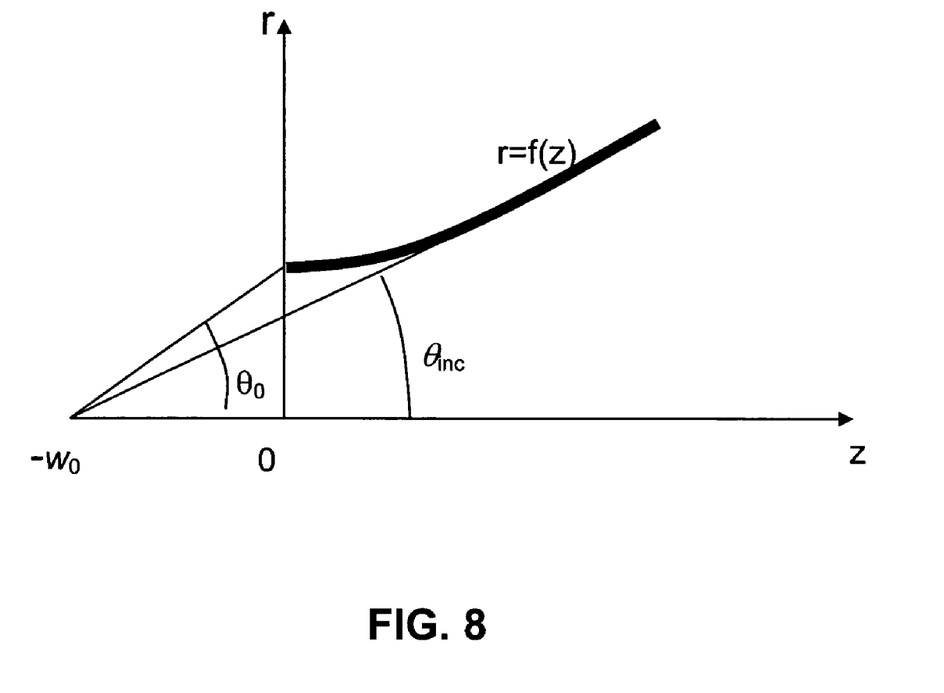
FIG. 8 is a graph of radius as a function of axial position for a horn-like shaped non-focusing optic according to an embodiment of the present invention.

The horn-like shaped reflector 712 has the shape of a surface of revolution based on the curve $f(z)$ as shown in FIG. 8. An entrance aperture 716 of the optic 712 is located at the plane z=0, and the reflective surface is located at the radius $r=f(z)$. A point source of x-rays is located on the axis of symmetry at $z=-w_0$ so that the nominal working distance is $w_0$. In practice, the reflector 712 may be scanned by translating it along the axis of symmetry (the z-axis), thereby changing the working distance. For the purpose of analysis, it is easier to think of keeping the reflector fixed and translating the source so that the working distance is a variable equal to a nominal value $w_0$ plus a small variable scanning distance a.

$$w = w_0 + a$$

The reflector will usually be scanned over a small range, $2a_0$, centered on the nominal working distance $w_0$. In the discussion and equations that follow the quantity $a_0$ is a fixed parameter for the total scanning range of the variable working distance was follows:

$$w_0 - a_0 \leq w \leq w_0 + a_0$$

The entrance aperture of the reflector subtends a half angle $\theta_0$, as shown in the diagram. In this case an x-ray from the source reflects from the surface at the point $(z, f(z))$ and makes an angle, $\theta_z$ with respect to the z-axis.

$$\theta_z = \tan^{-1}\left[\frac{f(z)}{z + (w_0 + a)}\right]$$

The angle of the surface, $\theta_s$, is equal to $$\theta_s = \tan^{-1} f'(z)$$

The x-ray makes an angle of incidence, $\theta_{inc}$, with the surface of $\theta_z - \theta_s$.

$$\theta_{inc} = \theta_z - \theta_s = \tan^{-1}\left[\frac{f(z)}{z + (w_0 + a)}\right] - \tan^{-1} f'(z)$$

In order to be reflected efficiently, the angle of incidence $\theta_{inc}$ must equal the Bragg angle for the multilayer film stack at that point. Since the angle of incidence varies along the surface, the multilayer film must also change accordingly. This is accomplished by varying the spacing of the film layers along the surface so that the Bragg angle matches the angle of incidence at each point of the surface for the desired x-ray energy. The correct layer spacing, d, can be calculated from the Bragg equation, where $\lambda$ is the desired x-ray wavelength $$\lambda = 2d \sin \theta_{inc}$$

This can be written in the more useful form $$d(z) = \frac{hc}{E_0 \sin\theta_{inc}(z)} = \frac{hc}{E_0 \sin\left[\tan^{-1}\left[\frac{f(z)}{z+w_0}\right] - \tan^{-1} f'(z)\right]}$$

where h is Planck's constant, c is the speed of light, $E_0$ is the energy of the desired x-ray and $f'(z)$ is the derivative of $f(z)$ with respect to z. If the reflector is manufactured so that the film layer spacing varies along the surface according to this equation, x-rays with energy $E_0$ will be reflected efficiently from each part of the surface. This will be true for any shape of surface, i.e., for any function $f(z)$, as long as the reflector is at the nominal position ($w=w_0$). It is noted that the above equation may be used to determine the gradient of the d-spacing for the simple case of a circularly cylindrical non-focusing reflector for which $f(z)=R$, where R is a constant radius of a cylinder. However, the efficiency of reflectivity for such a cylinder would not remain constant as the cylinder scans axially in the z direction. The problem becomes to choose a surface shape so that this property of efficient reflectivity remains at least approximately true when we scan the reflector.

If the reflector moves by a distance a, the new working distance is $w=w_0+a$. The angles of incidence are now different than they were at the nominal position, and the Bragg condition will be satisfied by a different x-ray energy. Consider two different points along the surface at $z_1$ and $z_2$. With the reflector at the nominal position they have two angles of incidence $\theta_{inc1}$ and $\theta_{inc2}$. The layer spacing d is designed so that they both reflect a single energy $E_0$. After moving the reflector a distance a, the two points will have two new angles of incidence $\theta'_{inc1}$ and $\theta'_{inc2}$. There will be two new x-ray energies that will be efficiently reflected, $E_1'$ and $E_2'$. These x-ray energies can be calculated by the equations $$E_1' = \frac{E_0 \sin\theta_{inc1}}{\sin\theta'_{inc1}}$$

$$E_2' = \frac{E_0 \sin\theta_{inc2}}{\sin\theta'_{inc2}}$$

It is desirable to have these two energies equal to each other, for any two points on the surface $z_1$ and $z_2$. We can see that if we make the ratio of the sines of the angles independent of z, this goal will be reached. For an arbitrary shape, the ratio will depend on both a and z, but we want to find a shape to minimize or eliminate the variation with z. The ratio determines the ratio of the new reflected energy to the nominal desired energy. We call this the scanning function, $h(a,z)$.

$$h(a,z) = \frac{E'(a,z)}{E_0} = \frac{\sin\theta_{inc}(z)}{\sin\theta'_{inc}(a,z)} = \frac{\sin\left[\tan^{-1}\left[\frac{f(z)}{z+w_0}\right] - \tan^{-1} f'(z)\right]}{\sin\left[\tan^{-1}\left[\frac{f(z)}{z+w_0+a}\right] - \tan^{-1} f'(z)\right]}$$

One method of finding a good surface shape is to start with a trial shape and vary it to minimize the variation of h (a, z) with z. For instance, a possible trial function $f_1(z)$ is a $3^{rd}$ order polynomial.

$$f_1(z) = b_0 + b_1 z + b_2 z^2 + b_3 z^3$$

It is possible to construct a function which measures the variation with z by evaluating the difference of h(a, z) from h(a, 0) at N points ($z_1, z_2, z_3, \ldots, z_N$) along the surface and summing the squares of the errors. The worst variation will probably occur for $a=a_0$, so it may be best to construct the function for that case. The resulting variation, $v_0$, can be calculated for any trial function.

$$v_0 = \sum_{n=1}^{n=N} (h(a_0, z_n) - h(a_0, 0))^2$$

It may be advantageous to construct a set of such variations, each evaluated at a different value of a ($a_0, a_1, a_2, a_3$, etc.) and then sum the squares of these $v_n$ for an improved measure of the variation, v. In either case, it only remains to vary the parameters of the trial function ($b_0, b_1, b_2, b_3$ in this case) until the variation is minimized. Minimization problems of this type are well known in the art, and various algorithms exist to solve them. One commonly used algorithm is known as Levenburg-Marquardt.

Another method for finding a shape is to require that the scanning function be strictly independent of z for a particular value of a, say $a_0$. We can do this by differentiating h with respect to z and setting the derivative equal to 0.

$$\frac{dh(a_0, z)}{dz} = 0$$

This produces an implicit second order differential equation for $f(z)$. If a definite value of a is inserted, this equation can be solved using any of a number of well-known numerical methods to produce a shape $f(z)$ which has zero variation of reflected energy along the surface for the particular value of a used in the solution, as well as for a=0. The variation in energy for other values of a will not be zero. The equation may be solved several times, each with a different value of a, and the various shapes obtained may be averaged to yield a shape in which the variation is not too large for all values of a to be included in the scan. One well-known method of numerically solving differential equations is known as Runge-Kutta.

Still another method of finding a shape makes use of the fact that the scanning function, h(a, z), depends linearly on a for values of a that are much smaller than the nominal working distance ($a \ll w_0$). We can expand the expression for h in a power series in a and keep only the constant and linear term.

$$h(a, z) = 1 - \frac{af(z)(w_0 + z + f(z)f'(z))}{((w_0+z)^2 + f(z)^2)((w_0+z)f'(z) - f(z))} + O[a^2] = 1 + ga + O[a^2]$$

We want to find a shape to make h independent of z. We can do that by forcing g to be a constant independent of z, which generates a first order differential equation for $f(z)$. This equation can be solved by the same techniques mention earlier for the second order equation.

$$f'(z) = \frac{f(z)(w_0+z)[gf(z)^2 + g(w_0+z) - 1]}{g(w_0+z)^3 + f(z)^2[g(w_0+z) + 1]}$$

The solution of this equation produces a family of solutions parameterized by the constant g. These solutions allow efficient reflection over the entire reflector as long as the scan distance, a, is much smaller than the nominal working distance, $w_0$.

A non-focusing multilayer optic of the types described herein may be used as monochromators in an x-ray detection sub-assembly of an EPMA. Radially or axially scannable non-focusing x-ray monochromators as described herein may obviate the need for multiple reflectors thereby allowing for a turret-less monochromator while retaining the energy scanning capabilities of a multiple system. The freedom of shape possible with non-focusing optics allows for one or more of larger collected solid angle, scanability, and angular detection. Use of non-focusing x-ray optics in EPMA systems would enable higher precision and faster throughput of EPMA applications to thin film measurement in semiconductor fabrication. Such embodiments of the present invention would enable the background level around an emission line to be measured and therefore increase the accuracy and matching of EPMA applications. Such embodiments of the present invention would also aid in the measurement of concentration depth profiles by the use of emission angle information. Non-focusing x-ray monochromators of the type described herein may be used in conjunction with a cassette configuration as described with respect to FIG. 1 and FIG. 2. In addition, x-ray monochromators that use non-focusing reflectors as described herein may be used in conjunction with a more conventional turret design.

Turret-less x-ray monochromators and EPMA systems according to embodiments of the present invention provide numerous advantages over conventional turret-based designs. Cassette-based embodiments of the present invention allow for greater solid angle collection than in turret-based designs by overcoming geometric constraints placed on the working distance in a turret-based design. Non-focusing embodiments of the present invention enable the collection of much larger solid angles of x-rays than previous cylindrical designs. In a fixed configuration, non-focusing monochromators may be of lower cost and easier to manufacture than an ellipsoidal design. Scannable versions of non-focusing monochromators enable scanning where the ellipsoidal design does not. Any of the embodiments can be used with a position sensitive detector to obtain information about the emission angles of the x-rays. The position sensitive detector may be a semiconductor array, charge-coupled-device (CCD), multiwire proportional counter or other position sensitive x-ray detector.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A turret-less x-ray monochromator apparatus, comprising:
   one or more x-ray reflectors that are configured to be selectively positioned in situ in sufficient proximity to a known location of a source of x-rays to collect the x-rays over a solid collection angle greater than 0.010 steradians, wherein the one or more reflectors are not mounted in a turret;
   a detector positioned to detect x-rays from the source that are reflected by the one or more reflectors; and
   means for scanning the one or more reflectors to reflect x-rays of different energies to the detector.

2. The apparatus of claim 1, further comprising a cassette configured to store one or more of the x-ray reflectors; a positioning mechanism located proximate the known location, the positioning mechanism being adapted to receive a reflector; and a transfer mechanism adapted to transfer a reflector from the cassette to the positioning mechanism and/or transfer a reflector from the positioning mechanism to the cassette.

3. The apparatus of claim 2 wherein the cassette is positioned at a sufficient distance from the positioning mechanism that the cassette does not interfere with an ability of the positioning mechanism to place a reflector close enough to the known location that the reflector can collect x-rays from the known location over a solid angle of about 0.010 steradians or greater.

4. The apparatus of claim 2 wherein the cassette and reflector positioner are housed in a vacuum chamber containing an aperture for the entry of x-rays from the known location.

5. The apparatus of claim 4 wherein the vacuum chamber is attached to a source of the x-rays originating at the known location.

6. The apparatus of claim 5 wherein the source of x-rays is an electron probe micro-analysis (EPMA) system having an electron beam column that focuses x-rays onto a surface of a sample, wherein the known location is on the surface of the sample.

7. The apparatus of claim 6 wherein the vacuum chamber is attached to the EPMA system so that the entry aperture is aligned with an x-ray detector port of the EPMA system.

8. The apparatus of claim 2 wherein one or more x-ray reflectors include one or more scannable circular cylindrical x-ray reflectors.

9. The apparatus of claim 2 wherein the one or more x-ray reflectors include one or more non-scannable reflectors.

10. The apparatus of claim 9 wherein the one or more non-scannable reflectors are optimized for detection of individual elements.

11. The apparatus of claim 9 wherein the non-scannable detectors have one or more of the following properties: multilayer coatings that are not efficient at more than one narrow energy range, multilayer coatings that have a graded interlayer spacing (d-spacing) for increased solid angle collection, elliptical cylindrical shapes, and doubly curved ellipsoidal shapes.

12. The apparatus of claim 2 wherein the x-ray reflectors could include more than 5 reflectors.

13. The apparatus of claim 2 wherein the positioning mechanism receives a reflector from the cassette and places the reflector into position for reflecting x-rays from the known location.

14. The apparatus of claim 2 wherein the positioning mechanism is adapted to scan the reflector during a spectrum measurement.

15. The apparatus of claim 14 further comprising a base plate attached to the positioning mechanism, wherein a mask containing an aperture and a detector are mounted to the base plate.

16. The apparatus of claim 15 wherein the mask is removable mounted to the base plate, whereby masks having different sized apertures can be mounted to the base plate.

17. The apparatus of claim 16 wherein the aperture is slightly larger than a focal spot size produced by the reflector and of the same shape as the spot size produced by the reflector.

18. The apparatus of claim 16 further comprising an aperture selector mechanism mounted to the detector, the aperture selector mechanism having two or more different apertures that can be selectively interposed between the reflector and the detector.

19. The apparatus of claim 2, further comprising a cassette positioner, wherein the cassette positioner is configured to move the cassette to bring a reflector location in the cassette in line with the transfer mechanism.

20. The apparatus of claim 17 wherein the transfer mechanism is configured to transfer a reflector from the reflector location to the positioning mechanism and/or vice versa by linear motion of the reflector.

21. The apparatus of claim 2 wherein the cassette includes locations for storing five (5) or more reflectors.

22. The apparatus of claim 21 wherein the five or more reflectors include between about seven (7) and about twenty (20) reflectors.

23. The apparatus of claim 21 wherein the five or more reflectors include different reflectors with a different reflector for every K, L and M x-ray line between about 0.15 keV and about 2.0 keV.

24. An x-ray monochromator apparatus, comprising:
a non-focusing x-ray reflector characterized by a shape that does not focus x-rays, the non-focusing x-ray reflector being positioned in sufficient proximity to a known location of a source of x-rays to collect the x-rays over a solid collection angle and reflect the x-rays towards a detector.

25. The apparatus of claim 24, wherein the detector is a large area detector configured to intercept x-rays from the known location that are reflected by the non-focusing reflector.

26. The apparatus of claim 25 wherein the detector is adapted to determine a position where an x-ray lands on the detector, whereby the detector is a position sensitive detector.

27. The apparatus of claim 26 wherein the position sensitive detector is a semiconductor array, charge-coupled-device (CCD), multiwire proportional counter or other position sensitive x-ray detector.

28. The apparatus of claim 25 wherein the detector is a gas-filled proportional counter or a solid state detector.

29. The apparatus of claim 25 wherein the large area detector is in the form of an array of detectors.

30. The apparatus of claim 24 wherein the non-focusing reflector is an x-ray optic in the shape of a circular cylinder with the known location being located on a central axis of the cylinder.

31. The apparatus of claim 30 wherein the cylinder is in a fixed position with respect to the known location and detector.

32. The apparatus of claim 30 wherein an inside surface of the optic has a multilayer coating.

33. The apparatus of claim 32 wherein a d-spacing of the coating is graded to maintain a correct Bragg angle along the length of the optic.

34. The apparatus of claim 30, further comprising an aperture stop configured to prevent unreflected x-rays and stray electrons from entering the detector.

35. The apparatus of claim 30 wherein a maximum length of the optic is 2w, where w is a working distance between a front end of the optic and the known location of the source of x-rays.

36. The apparatus of claim 30 wherein the cylinder is manufactured in two or more longitudinal sections.

37. The apparatus of claim 30 wherein the cylinder is configured to perform a radial scan by changing a radius of the cylinder.

38. The apparatus of claim 37, further comprising an aperture stop configured to prevent unreflected x-rays and stray electrons from entering the detector wherein the aperture stop is configured to move axially toward the known location as the cylinder radius is increased in order to prevent unreflected x-rays from passing through the new enlarged cylinder.

39. The apparatus of claim 37 wherein the cylinder is made of multiple cylindrical segments configured to move radially with respect to a central axis of the cylinder.

40. The apparatus of claim 39 wherein each cylindrical segment is rigid and does not change its curvature as it moves radially with respect to the central axis, and the resulting reflecting surface of the expanded array does not lie on a circle.

41. The apparatus of claim 39 wherein the multiple cylindrical segments include four or more segments.

42. The apparatus of claim 39 wherein the multiple cylindrical segments include six or more segments.

43. The apparatus of claim 24 wherein the non-focusing optic includes a conical-shaped optic, wherein the conical shaped optic is characterized by an axis of conical symmetry.

44. The apparatus of claim 43 wherein the known location is located on the axis of conical symmetry.

45. The apparatus of claim 24 wherein the non-focusing optic has horn-like shape that is symmetric about a central axis.

46. The apparatus of claim 45 wherein the horn-like shape is selected such that an axial scan of the non-focusing optic allows different energy x-rays from the known location to be reflected to the detector.

47. An electron probe micro-analysis (EPMA) system, comprising:
an electron beam column configured to focus a beam of electrons at a known location on a surface of a sample;
an x-ray detector; and a non-focusing x-ray reflector disposed between the surface of the sample and the x-ray detector, the non-focusing x-ray reflector being configured to reflect x-rays originating at the sample surface toward the detector, wherein the non-focusing x-ray reflector is characterized by a shape that does not focus the x-rays.

48. An electron probe micro-analysis (EPMA) system, comprising:
an electron beam column configured to focus a beam of electrons at a known location on a surface of a sample;
an x-ray detector;
a cassette configured to store one or more of the x-ray reflectors; a positioning mechanism disposed between the cassette and the sample, the positioning mechanism being configured to receive an x-ray reflector and position the reflector proximate the known location; and a transfer mechanism adapted to transfer a reflector from the cassette to the positioning mechanism and/or transfer a reflector from the positioning mechanism to the cassette.

* * * * *